(12) United States Patent
Vayl

(10) Patent No.: US 6,686,770 B1
(45) Date of Patent: Feb. 3, 2004

(54) TRISTATE CIRCUIT FOR POWER UP CONDITIONS

(75) Inventor: Yefim Vayl, Carmel, IN (US)

(73) Assignee: Thomson Licensing S.A., Boulogne (FR)

(*) Notice: Subject to any disclaimer, the term of this patent is extended or adjusted under 35 U.S.C. 154(b) by 15 days.

(21) Appl. No.: 10/030,794

(22) PCT Filed: Jul. 14, 2000

(86) PCT No.: PCT/US00/19258
§ 371 (c)(1),
(2), (4) Date: Jan. 11, 2002

(87) PCT Pub. No.: WO01/06655
PCT Pub. Date: Jan. 25, 2001

Related U.S. Application Data

(60) Provisional application No. 60/144,422, filed on Jul. 16, 1999.

(51) Int. Cl.⁷ .............................................. H03K 19/00

(52) U.S. Cl. .............................. 326/56; 326/57; 326/34

(58) Field of Search ............................... 326/56–58, 31, 326/33

(56) References Cited

U.S. PATENT DOCUMENTS

| | | | | |
|---|---|---|---|---|
| 4,210,829 A | * | 7/1980 | Wong et al. | 307/296 R |
| 4,871,926 A | | 10/1989 | Neely et al. | 307/272.3 |
| 5,028,817 A | | 7/1991 | Patil | 307/443 |
| 5,136,185 A | | 8/1992 | Fleming et al. | 307/443 |
| 5,274,284 A | | 12/1993 | Krenik et al. | 307/475 |
| 5,610,537 A | | 3/1997 | Hastings | 326/59 |
| 5,874,853 A | * | 2/1999 | Yamaguchi et al. | 327/545 |

FOREIGN PATENT DOCUMENTS

JP    60-116223    6/1985   ............ H03K/3/02

* cited by examiner

*Primary Examiner*—Anh Tran
(74) *Attorney, Agent, or Firm*—Joseph S. Tripoli; Robert D. Shedd

(57) ABSTRACT

In an electronic circuit and/or component, such as a television, that requires a tri-state condition when the electronic circuit/component is powered up, a tri-state circuit may be employed. The present tri-state circuit includes a control circuit operably coupled to an enable input of a tri-state buffer. During power-up of the electronic circuit, the control circuitry is operable to prevent data from passing from an input of the tri-state buffer to an output of the tri-state buffer until a predetermined time period wherein the control circuitry is operable to allow data to pass from the input to the output of the tri-state buffer.

4 Claims, 1 Drawing Sheet

US 6,686,770 B1

TRISTATE CIRCUIT FOR POWER UP CONDITIONS

This application claims the benefit under 35 U.S.C. §365 of International Application PCT/US00//19258, filed Jul. 14, 2000, which was published in accordance with PCT Article 21(2) on Jan. 25, 2001 in English; and which claims benefit of U.S. Provisional Patent Application Ser. No. 60/144,422 filed Jul. 16, 1999.

FIELD OF THE INVENTION

The present invention relates to tri-state condition circuits and, more particularly, to a tri-state condition circuit for power-up conditions.

BACKGROUND OF THE INVENTION

Televisions and other electronic devices have various complex electronic circuits that may be analog, digital, or a combination of analog and digital. Because of their complexity, good design characteristics or criteria dictate that the fewer the components the better. As well, some of these electronic circuits require different state conditions during various stages of operation. In a power-up condition, for example, it may be desirous to provide a signal to a common circuit that is not to be provided after steady state is reached, and/or vice versa.

One type of device that provides different state conditions, and thus different output results, is known as a tri-state buffer. A tri-state buffer is operable in three states, and has an input, an output, and an enable port. The enable port provides control of the tri-state buffer. When the enable is in a first state, the tri-state buffer is in a high impedance mode meaning that it will look like an open circuit. When the enable is in a second state, data or a signal on the input is allowed to pass to the output, regardless of the type of data or signal. Control of the tri-state buffer however, is typically accomplished by a high (logic "1") or low (logic "0") signal that is supplied by a micro controller. The enable is not controlled by a variable control circuit.

It is desirous to provide a tri-state condition circuit that is more flexible than prior art tri-state buffers. It is further desirous to provide a tri-state condition circuit that provides a tri-state conditions under power-up.

SUMMARY OF THE INVENTION

The present invention involves apparatus comprising a buffer circuit and a control circuit that generates a control signal for controlling the mode of operation of the buffer circuit. The buffer circuit has a first mode of operation during which an output signal produced by the buffer circuit exhibits one of first and second logic states in response to respective logic states of an input signal, and having a second mode of operation during which the output signal exhibits a third logic state independent of the logic states of the input signal. The control circuit generates a control signal that causes the buffer circuit to selectively operate in one of the first and second modes of operation. The control circuit generates the control signal only directly in response to operating power being applied to the control circuit. The control circuit generates the control signal for causing the buffer circuit to operate in the second mode of operation only for a predetermined interval subsequent to operating power being applied to the control circuit. The control circuit generates the control signal for causing the buffer circuit to operate in the first mode of operation at all times other than the predetermined interval.

Another aspect of the invention involves operating circuitry coupled to receive the output signal produced by the buffer circuit and being responsive to the third logic state of the output signal of the buffer circuit for entering a normal mode of operation subsequent to the application of operating power to the operating circuitry.

BRIEF DESCRIPTION OF THE DRAWINGS

Reference to the following description of the present invention should be taken in conjunction with the accompanying drawings, wherein.

Corresponding reference characters indicate corresponding parts throughout the several views.

DETAILED DESCRIPTION OF THE INVENTION

Figure 1:
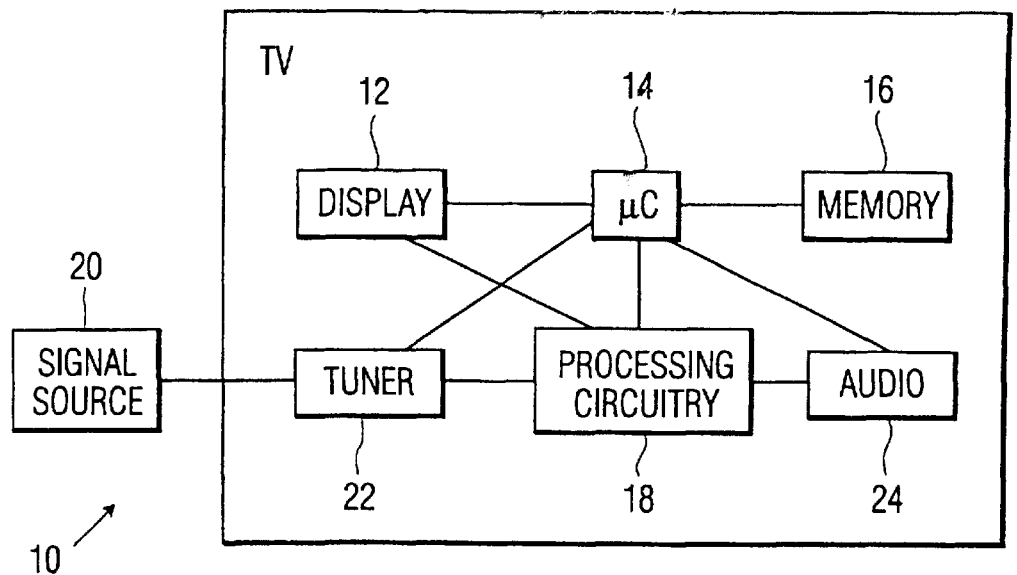
FIG. 1 is a block diagram of an exemplary device in which the present invention may be utilized.

With reference to FIG. 1, a television apparatus, generally designated 10, is represented in block diagram form. It should initially be appreciated that the television apparatus 10 represents the many components or devices that may utilize the present invention. In particular, any electronic component/device that requires a tri-state condition upon a power-up condition of the component/device, may utilize the present tri-state circuit and/or principles described herein. For example, any device that includes operating circuitry requiring tri-state operation, including producing a high-impedance level, in order to properly enter a normal mode of operation following application of operating power to the operating circuitry (i.e., following a power-up condition) may utilize the apparatus described herein.

The television apparatus 10 may or may not include a monitor or other similar display device 12. The television apparatus 10 as well, may or may not include a micro controller ("µC") or control circuitry 14 for providing general control of the various components of the television apparatus 10, memory 16, an audio reproduction section 24, appropriate processing circuitry 18, and a tuner 22. The various components depicted in FIG. 1 are only exemplary, as other and/or different components may be part of the television apparatus 10. Additionally, other devices may have different components. In any case, the term television apparatus 10 should hereinafter be construed to cover all types of electrical devices each having various components unless indicated otherwise.

The television apparatus 10 is typically adapted through the various components, appropriate circuitry, and/or software, to decode and/or process digitally modulated analog audio and video television signals or transmissions ("digital television signals") from any source, represented by signal source 20, and to decode and/or process analog audio and video television signals ("analog television signals") from the signal source 20. Such processing typically includes digitizing the analog video and/or audio signals through appropriate circuitry, software, and/or other components, and/or decoding the digital video and/or audio signals.

As an example, the television apparatus 10 may be a model DTC 100, from Thomson Consumer Electronics, Inc. of Indianapolis, Ind. As another example, a component may be a DM1 digital module from Thomson Consumer Electronics, Inc. of Indianapolis, Ind. In the case of the television apparatus, the television apparatus 10 typically includes appropriate circuitry, software, and other components to support/provide a display, an integral control system, a user-interface and on-screen display (OSD) functionality. It should be appreciated that the television apparatus 10 may take other forms and have additional capabilities and/or functionality other than those shown and/or discussed through appropriate circuitry, software, and/or other components. As well, it should be appreciated that the various connections and/or interconnections depicted in FIG. 1 are exemplary, and thus, such connections/interconnections may vary.

Figure 2:
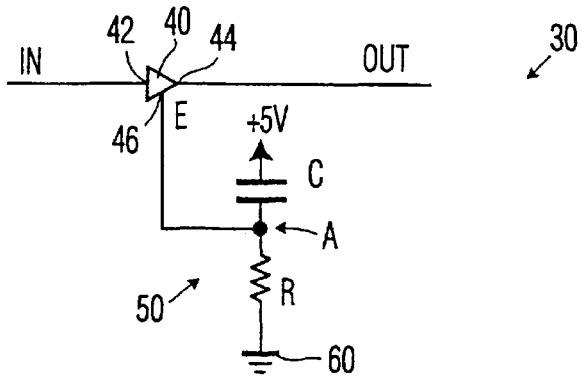
FIG. 2 is a circuit diagram of the present invention.

The television apparatus 10 may require different states or signals during a power-up condition (i.e. the television apparatus 10 has been turned "on"). This may be accomplished with a circuit producing an output signal having at least three logic states (e.g., logic 0 (or low level state), logic 1 (or high level state), high-impedance (or high-Z state)) such as a tri-state circuit per the principles of the present invention, an example of which is depicted in FIG. 2. During a first mode of operation of the tri-state circuit, the logic state of the output produced by a buffer circuit included in the tri-state circuit is determined in response to the logic state of the input signal to the buffer circuit. During a second mode of operation of the buffer circuit, the output of the buffer circuit is in a high-impedance condition, or high Z, state independent of the logic state of the input signal to the buffer circuit.

Referring to FIG. 2, there is shown a tri-state circuit, generally designated 30, for a power-up condition. It should be appreciated that although the tri-state circuit 30 is described with reference to the television apparatus 10, the tri-state circuit 30 is applicable in any electronic circuit application. The tri-state circuit 30 includes a tri-state buffer 40 and a control circuit or differentiator 50. The tri-state buffer 40 has an input (IN) 42, an output (OUT) 44, and an enable (E) 46. The input 42 is adapted to receive data or a signal from a data/signal source (not shown). The output 44 is adapted to output the data or signal as received on the input 42 depending on the state of the enable 46.

When the control signal for tri-state buffer (or buffer circuit) 40, i.e., enable 46, is in a high state or voltage (a logic "1"), the tri-state buffer 40 is in a high impedance state and thus acts as an open circuit. Any data or signal present at the input 42 during the time that the enable 46 is high will not be passed to the output 44. That is, the output signal produced by buffer 40 maintains a high-impedance, or high-Z, logic state independent of the logic state of the input signal. When the enable is in a low state or voltage (a logic "0"), the tri-state buffer 40 will pass any data or signal present at the input 42 to the output 44. That is, the output signal produced by buffer 40 exhibits a logic state in response to the logic state of the input signal. In practical terms, the passing of data or a signal from the input 42 to the output 44 is controlled by the enable 46, where the enable 46 is driven by an applied voltage. A low voltage corresponds to a low state (logic "0") of the enable 46, while a high voltage corresponds to a high state (logic "1") of the enable 46. As an example of a typical tri-state buffer, a voltage of approximately 0.7 V or less will cause the enable 46 to enter the low state, while a voltage higher than approximately 2.0 V will cause the enable 46 to enter a high state.

A truth table for the tri-state buffer 40 is:

| Inputs | | Output |
|---|---|---|
| IN | E | OUT |
| X | 1 | Z |
| 0 | 0 | 0 |
| 1 | 0 | 1 | where:
X=not care
Z=high impedance state

The control circuit 50 provides a control signal, e.g. a voltage, to the enable 46 to cause the enable 46 to be in either a low state or a high state. The control circuit is coupled at one end to a voltage source, here 5 volts, and coupled at another end to ground 60. The control circuit 50 is adapted/configured to initially provide a low state to the enable 46 upon immediate power-up (i.e. during the time before the voltage source reaches a steady state) for a brief time period. During this brief initial time period, data or a signal at the input 42 is passed to the output 44. As the voltage from the voltage source is applied to the control circuit 50, the control circuit provides a voltage (preferably a proportional voltage) to the enable 46. When the voltage of the control circuit 50 reaches a transition threshold (e.g. above approximately 2.0 V) the enable 46 changes from the low state to a high state. After the voltage of the control circuit 50 reaches a steady state, the control circuit 50 will continue to provide a voltage sufficient to keep the enable 46 in a high state for a predetermined period of time. The predetermined period of time is a function of the time constant ($\tau$) of the control circuit 50, which is a function of the various components of the control circuit 50, the connection scheme of the various components, and the value of the various components.

Stated differently, the control circuit 50 generates a control signal, or enable, causing the buffer circuit to selectively operate in one of the first and second modes of operation. For example, the first mode of operation corresponds to the buffer circuit operating to produce an output signal having one of first and second logic states that are produced in response to respective logics states of the input signal to the buffer circuit. The second mode of operation corresponds to the output signal exhibiting a third logic state, e.g., a high impedance state, independent of the logic state of the input signal. The control circuit generates the control signal only directly in response to operating power being applied to the control circuit. Also, the control circuit generates the control signal causing the buffer circuit to operate in the second mode of operation only for a predetermined interval subsequent to operating power being applied to the control circuit. The control circuit generates the control signal causing the buffer circuit to operate in the first mode of operation at all times other than the predetermined interval.

Thus, the control circuit generates the control signal to change the operating mode of the buffer circuit only in response to operating power being applied to the control circuit. The operating mode of the buffer circuit does not change at other times, i.e., not at any time during normal operation of the apparatus. As a result, the third, or high-impedance, state of the buffer circuit output is produced only directly in response to operating power being applied, i.e., during power up, and only for a predetermined finite time period thereafter. The high-impedance state of the buffer circuit output is not produced at other times, i.e., not at any time during normal operation of the apparatus. Thus, the buffer circuit is utilized only during power-up to provide a high-impedance condition of predetermined duration. The output signal of the buffer circuit is coupled to operational circuitry that responds to the third logic state, or high impedance condition, by entering a normal mode of operation. Without the high-impedance condition, the operational circuitry would not enter normal operating mode properly.

In one form, as depicted in FIG. 2, the control circuit 50 comprises a capacitor C electrically coupled in series with a resistor R. The capacitor C is electrically coupled to the voltage source (designated in FIG. 2 as "+5 V"), while the resistor R is electrically coupled to ground 60. The control circuit 50 depicted in FIG. 2 is a series R-C circuit. The enable 46 is electrically coupled to the control circuit 50 at point A (between the series coupled capacitor C and the resistor R). The voltage at point A is graphically depicted in FIG. 3.

Figure 3:
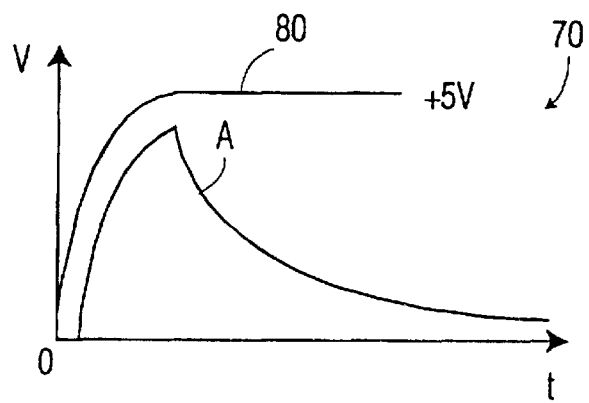
FIG. 3 is a timing graph of voltage for a point "A" of the circuit of FIG. 2.

With reference to FIG. 3, there is depicted a graph, generally designated 70, of voltage (v) versus time (t) wherein point A of the control circuit 50 is plotted as curve A. Also depicted in graph 70 is a curve of the voltage source, generally designated 80. At time zero (t=0), or before a voltage is applied to the control circuit 50, the voltage is zero (v=0). When a voltage from the voltage source is applied to the control circuit 50, the voltage from the voltage source rises until a steady state is reached (here +5 volts). When the voltage at point A reaches the threshold value (approximately 2.0 volts), the enable 46 is changed to a high state. During the time necessary for the voltage from the voltage source to reach the steady state, the capacitor C is charging. When the voltage from the voltage source reaches the steady state, the voltage on the capacitor C (and thus point A) reaches a maximum value. During the steady state, the voltage at point A begins to decay. When the voltage decays after the predetermined time period to the threshold (approximately 0.7 volts), the enable 46 is changed from high to low.

It should be appreciated that the values of R and C may be chosen to provide any value of time constant so that the tri-state buffer 40 may be kept in a high state for any desired predetermined time period (corresponding to the time constant of the circuit). As well, it should be appreciated that other circuit configurations may provide the same or similar timing. The values of the various components of other circuits would be variable to provide any predetermined time period in accordance with the principles of the present invention.

While this invention has been described as having a preferred design and/or configuration, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. Apparatus comprising:

a buffer circuit having a first mode of operation during which an output signal produced by the buffer circuit exhibits one of first and second logic states in response to respective logic states of an input signal, and having a second mode of operation during which the output signal exhibits a third logic state independent of the logic states of the input signal, said third logic state comprising a high impedance state;

a control circuit for generating a control signal for causing the buffer circuit to selectively operate in one of the first and second modes of operation; the control circuit being operative for generating the control signal only directly in response to operating power being applied to the control circuit; the control circuit generating the control signal for causing the buffer circuit to operate in the second mode of operation for a predetermined interval subsequent to operating power being applied to the control circuit, said predetermined interval being a function of a time constant of said control circuit; and an operating circuit being coupled to receive the output signal produced by the buffer circuit, said operating circuit being of a type responsive to said high impedance state of the output signal produced by the buffer circuit for entering a normal mode of operation after application of said operating power;

and wherein:

(i) said control circuit being the sole source of said control signal for said buffer circuit;

(ii) said control circuit causing said buffer circuit to operate in said first mode of operation at all times other than said predetermined interval;

(iii) said high impedance state of said buffer circuit output is produced only directly in response to said operating power being applied during power up and only for a predetermined finite time period thereafter.

2. The apparatus of claim 1 wherein the control circuit comprises a differentiator and wherein the differentiator comprises a resistor and a capacitor coupled in series between a source of operating voltage and a reference level.

3. The apparatus of claim 2, wherein the control signal is produced at a circuit node between the resistor and the capacitor.

4. The apparatus of claim 3, wherein one terminal of the capacitor is electrically coupled to the source of operating voltage and one terminal of the resistor is electrically coupled to the reference level.

* * * * *